(12) United States Patent
Lee et al.

(10) Patent No.: US 9,780,106 B2
(45) Date of Patent: Oct. 3, 2017

(54) TWO-TRANSISTOR NON-VOLATILE MEMORY CELL AND RELATED PROGRAM AND READ METHODS

(71) Applicant: Taiwan Semiconductor Manufacturing Company, Ltd., Hsin-Chu (TW)

(72) Inventors: Te-Liang Lee, Hsin-Chu (TW); Chin-Yuan Ko, Hsin-Chu (TW); Ming-Yih Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/575,761

(22) Filed: Dec. 18, 2014

(65) Prior Publication Data
US 2015/0102397 A1    Apr. 16, 2015

Related U.S. Application Data

(63) Continuation of application No. 13/624,291, filed on Sep. 21, 2012, now Pat. No. 8,947,938.

(51) Int. Cl.
| | | |
|---|---|---|
| *G11C 16/04* | (2006.01) | |
| *H01L 27/1156* | (2017.01) | |
| *H01L 27/11521* | (2017.01) | |
| *H01L 27/092* | (2006.01) | |
| *H01L 27/11548* | (2017.01) | |

(52) U.S. Cl.
CPC ...... *H01L 27/1156* (2013.01); *H01L 27/0928* (2013.01); *H01L 27/11521* (2013.01); *H01L 27/11548* (2013.01)

(58) Field of Classification Search
CPC ............. H01L 27/1156; H01L 27/0928; H01L 27/11548; H01L 27/11521
USPC ........... 365/185.18, 185.24, 185.14; 257/315
See application file for complete search history.

(56) References Cited

U.S. PATENT DOCUMENTS

| | | | |
|---|---|---|---|
| 5,604,700 A * | 2/1997 | Parris | H01L 27/115 257/E27.103 |
| 5,719,427 A | 2/1998 | Tong et al. | |
| 5,986,492 A * | 11/1999 | Hobbs | H03K 5/00 327/284 |
| 6,222,764 B1 | 4/2001 | Kelley et al. | |
| 6,404,006 B2 | 6/2002 | Li et al. | |
| 6,788,576 B2 | 9/2004 | Roizin | |
| 6,950,342 B2 | 9/2005 | Lindhorst et al. | |
| 7,339,829 B2 | 3/2008 | Sarig | |
| 7,679,119 B2 | 3/2010 | Roizin et al. | |

(Continued)

FOREIGN PATENT DOCUMENTS

| | | |
|---|---|---|
| EP | 0623959 | 11/1994 |
| JP | 09185891 | 7/1997 |

*Primary Examiner* — Tha-O H Bui
(74) *Attorney, Agent, or Firm* — Slater Matsil, LLP

(57) ABSTRACT

A memory device includes an N-channel transistor and a P-channel transistor. A word line is electrically connected to a drain terminal of the N-channel transistor, and a source terminal of the P-channel transistor. A first bit line is electrically connected to a source terminal of the N-channel transistor. A second bit line is electrically connected to a drain terminal of the P-channel transistor. Gate terminals of the N-channel transistor and the P-channel transistor are electrically connected and floating.

20 Claims, 14 Drawing Sheets

(56) References Cited

U.S. PATENT DOCUMENTS

| | | |
|---|---|---|
| 7,700,994 B2 | 4/2010 | Roizin et al. |
| 7,859,043 B2 * | 12/2010 | Pikhay ............... G11C 16/0441 |
| | | 257/314 |
| 8,064,274 B2 | 11/2011 | Fisch et al. |
| 8,947,938 B2 * | 2/2015 | Lee ................... H01L 27/11521 |
| | | 257/315 |
| 2009/0213660 A1 | 8/2009 | Pikhay et al. |
| 2011/0216596 A1 | 9/2011 | Choi |

* cited by examiner

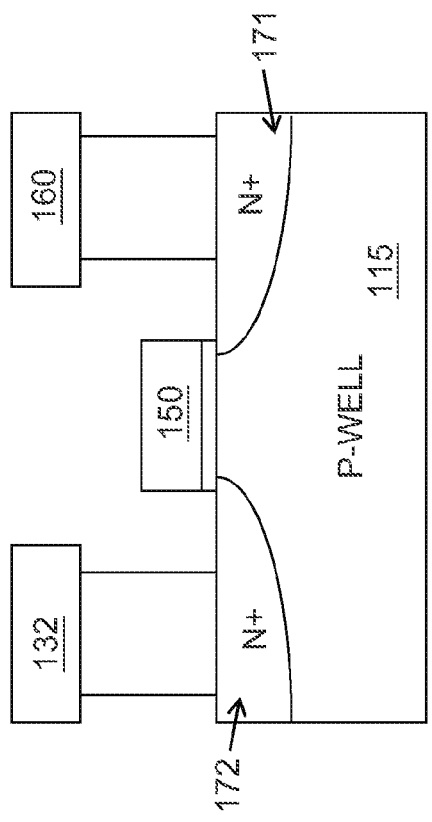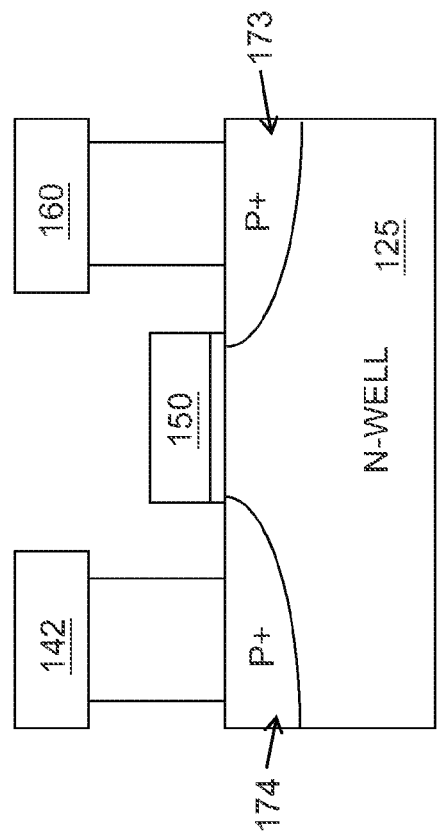

TWO-TRANSISTOR NON-VOLATILE MEMORY CELL AND RELATED PROGRAM AND READ METHODS

PRIORITY CLAIM

This application claims priority to and is a continuation of U.S. Pat. No. 8,947,938 B2, filed Sep. 21, 2012, and entitled "Two-Transistor Non-Volatile Memory Cell and Related Program and Read Methods," which application is incorporated herein by reference.

BACKGROUND

Non-volatile memory (NVM) is used in various devices, such as computers. NVM is a type of memory storage that can retain data even while it is not powered on. NVM may be electrically addressed or mechanically addressed. Examples of electrically addressed NVM include flash memory, EPROMs, and EEPROMs. NVM may also be one-time programmable (OTP) or multiple-times programmable (MTP). NVM being "logic-compatible" indicates that the NVM can be manufactured using an existing logic semiconductor process, without adding special steps or materials.

With scaling down of critical dimension (CD) in semiconductor processes, NVM performance becomes harder to achieve, particularly in areas of design complexity, cycle time, cost, retention, and operating margins (read, write, erase). There is a need for an NVM device that scales down well, while maintaining high performance in the above areas.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 3 is a cross sectional view of the memory cell taken along section line 3-3 of FIG. 2;

FIG. 4 is a cross sectional view of the memory cell taken along section line 4-4 of FIG. 2;

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a non-volatile memory (NVM) device and the like. Other embodiments may also be applied, however, to other devices which provide memory storage.

Throughout the various figures and discussion, like reference numbers refer to like components. Also, although singular components may be depicted throughout some of the figures, this is for simplicity of illustration and ease of discussion. A person having ordinary skill in the art will readily appreciate that such discussion and depiction can be and usually is applicable for many components within a structure.

A novel two-transistor (2T) non-volatile memory (NVM) cell in accordance with various embodiments is described. The 2T NVM cell can be programmed through channel hot electron injection (CHEI) and/or channel hot hole induced hot electron (CHHIHE), and erased through band-to-band hot hole (BBHH) injection and/or Fowler-Nordheim (FN) electron ejection. A differential read scheme may be used to shrink dimensions of the 2T NVM cell. The 2T NVM cell includes an N-channel transistor and a P-channel transistor that share a floating gate. The N-channel and P-channel transistor may be metal-oxide-semiconductor field effect transistors (MOSFETs), including standard MOSFETs, high voltage MOSFETs, core MOSFETs, and/or input/output (I/O) MOSFETs.

Figure 1:
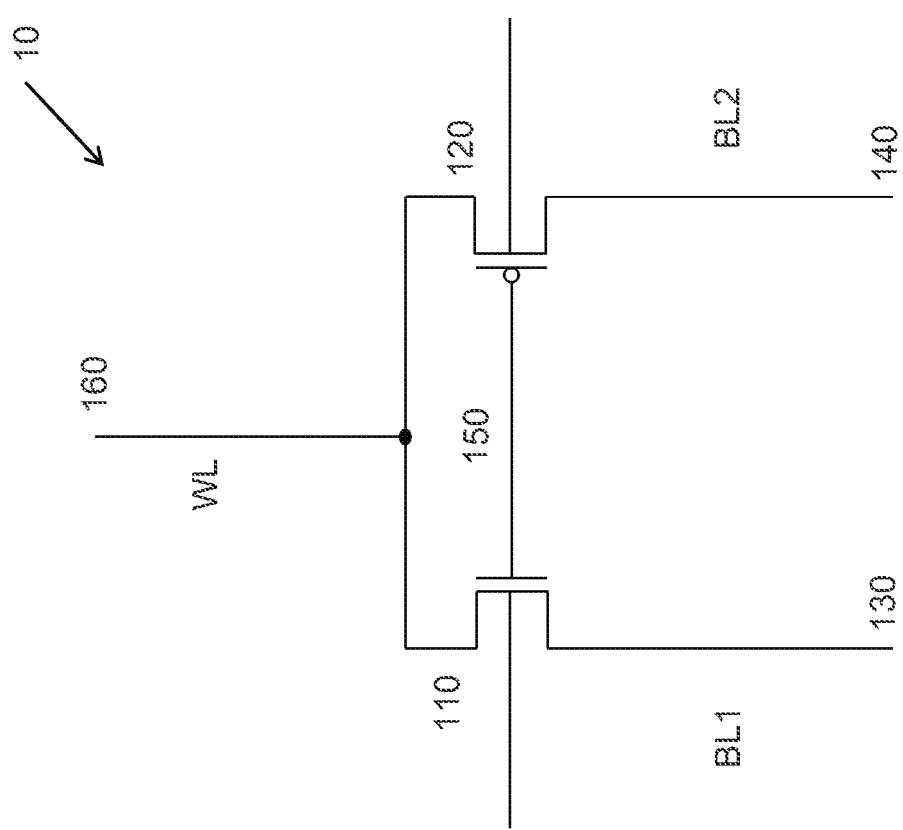
FIG. 1 is a circuit diagram of a memory cell according to some embodiments of the present disclosure.
Figure 2:
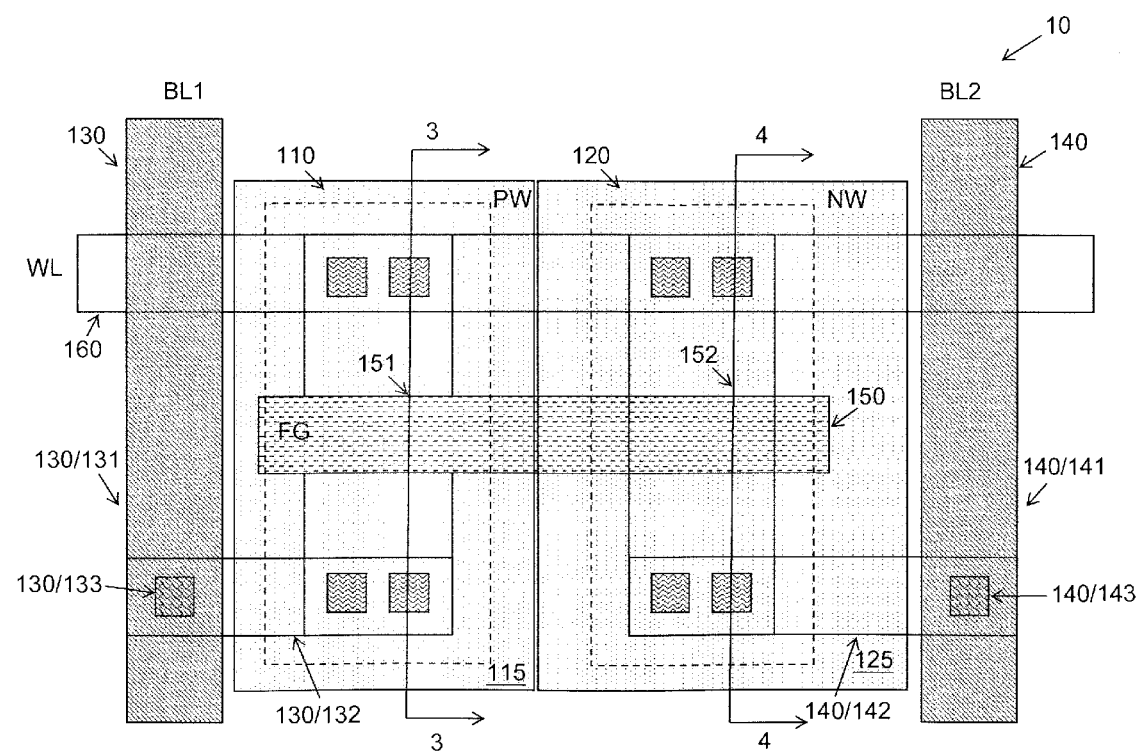
FIG. 2 is a top layout view of the memory cell in accordance with various embodiments of the present disclosure.
Figure 5:
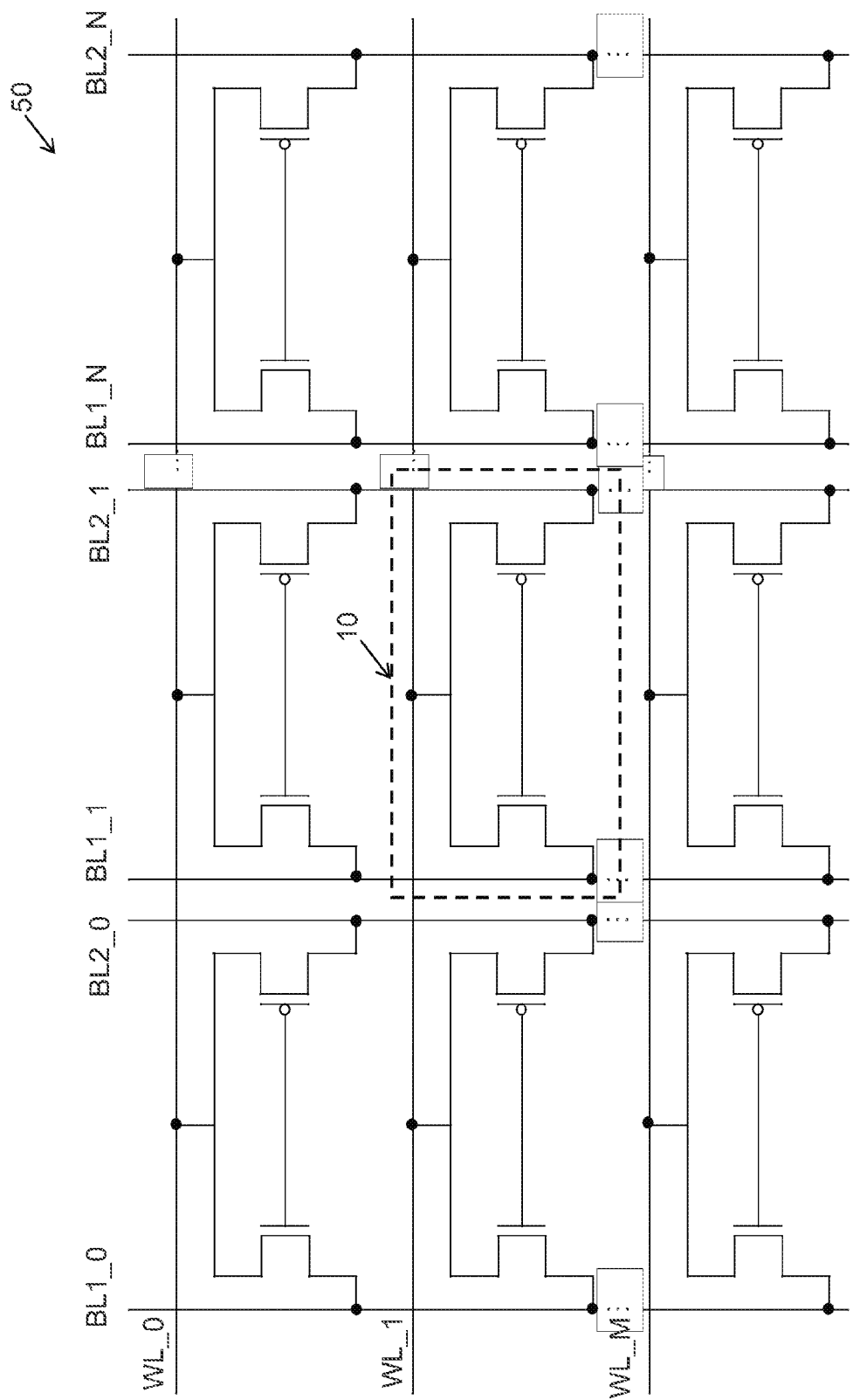
FIG. 5 is a circuit diagram of an array of memory cells in accordance with various embodiments of the present disclosure.

FIG. 1 illustrates a memory cell 10 including an N-channel transistor 110 and a P-channel transistor 120 in accordance with various embodiments of the present disclosure. Layout views of the memory cell 10 are shown in FIGS. 2-4. A circuit diagram of a memory array 50 of memory cells the same as the memory cell 10 is shown in FIG. 5. In general, the memory array 50 may be an MxN array, where M and N are both positive integers, and may be the same or different, e.g. a 1024×1024 array.

The N-channel transistor 110 and the P-channel transistor 120 are formed in and on a substrate, and share a floating gate (FG) structure 150. In some embodiments, the substrate can include an elementary semiconductor including silicon or germanium in crystal, polycrystalline, or an amorphous structure; a compound semiconductor including silicon carbide, gallium arsenide, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof.

The N-channel transistor 110 may be an N-channel metal-oxide-semiconductor (NMOS) transistor, for example. The N-channel transistor 110 includes N-type source and drain regions (terminals, electrodes) that are separated by a channel region and formed in a P-type well (PW) 115. The P-type well 115 may simply be a P-type substrate in some embodiments. A first portion 151 (shown in FIG. 2) of the floating gate structure 150 extends over the channel region between the source and drain regions of the N-channel transistor 110. The floating gate structure 150 may be a polysilicon gate formed over a gate dielectric, such as silicon oxide, for example. The source and drain regions may be N+ regions formed in the substrate by appropriate implantation or diffusion of, for example, group V elements, such as phosphorus, arsenic, antimony, or the like, into the substrate.

The P-channel transistor 120 may be a P-channel metal-oxide-semiconductor (PMOS) transistor, for example. The P-channel transistor 120 includes P-type source and drain regions (terminals, electrodes) that are separated by a channel region and formed in an N-type well (NW) 125. The P-type source and drain regions may be P+ regions formed in the N-type well 125 by appropriate implantation or diffusion of, for example, group III elements, such as boron, aluminum, or the like, into the N-type well 125. A second portion 152 (shown in FIG. 2) of the floating gate structure 150 extends over the channel region between the source and drain regions of the P-channel transistor 120. The second portion 152 and the first portion 151 of the floating gate structure 150 may be monolithic, or may be physically separated portions electrically connected by an interconnect structure, such as a metal line.

The memory cell 10 can be considered a two-transistor (2T) memory cell. It has been determined through experimentation that previous 2T memory cells using single-ended read encounter implementation difficulty at reduced critical dimension. Typical 2T memory cells may be implemented using a minimum floating gate oxide (Gox) thickness ranging from about 70 Angstrom to about 85 Angstrom. A novel interconnection scheme is used in the memory cell 10 to allow gate oxide thickness down to about 50 Angstrom for the 2T memory cell. In particular, a drain terminal of the N-channel transistor 110 and a source terminal of the P-channel transistor 120 are both electrically connected to a word line (WL) 160. A source terminal of the N-channel transistor 110 is electrically connected to a first bit line (BL1) 130, and a drain terminal of the P-channel transistor 120 is electrically connected to a second bit line (BL2) 140. It is noted that source and drain regions in metal-oxide-semiconductor field effect transistors (MOSFETs) are generally interchangeable.

FIGS. 3 and 4 are cross-sectional views showing portions of the memory cell 10 taken along section lines 3-3 and 4-4 of FIG. 2, respectively. The memory cell 10 layout shown in FIGS. 2-4 is only one of many possible layouts. The N-channel transistor 110 is formed in a P-type region, such as a P-type semiconductor substrate or a P-type well region in a semiconductor substrate. The P-channel transistor 120 is formed in an N-type well region formed in the P-type well region or P-type semiconductor substrate. The floating gate 150 may be a polysilicon gate, and extends through source and drain regions of both the N-channel transistor 110 and the P-channel transistor 120. The drain 171 (see FIG. 3) of the N-channel transistor 110 and the source 173 (see FIG. 4) of the P-channel transistor 120 are electrically connected to the word line 160, which may be formed in a first metal (M1) layer, for example, in a back-end-of-line (BEOL) process. The source 172 (see FIG. 3) of the N-channel transistor 110 is electrically connected to the first bit line 130, which may include a second metal (M2) line 131, an M1 line 132, and an M2-M1 contact via 133. The drain 174 (see FIG. 4) of the P-channel transistor 120 is electrically connected to the second bit line 140, which may include a second metal (M2) line 141, an M1 line 142, and an M2-M1 contact via 143. The first and second bit lines 130, 140 may have portions 131, 141 substantially perpendicular to the word line 160. Embodiments using different metal layers to realize the word line 160, the first bit line 130, and the second bit line 140 are contemplated. Accordingly, a non-volatile memory device is provided that exhibits the benefits described above with respect to thin gate oxide thickness, e.g. about 50 Angstrom.

The memory cell 10 may be programmed by channel hot electron injection (CHEI) and/or channel hot hole induced hot electron (CHHIHE), erased by band-to-band hot hole (BBHH) injection and/or Fowler-Nordheim (FN) electron ejection, and read differentially. To facilitate these operations, in the memory cell 10, the word line 160 is electrically connected to a voltage source (not shown) to receive a word line signal VWL. The first bit line 130 is electrically connected to a voltage source (not shown) to receive a first bit line signal VBL1. The second bit line 140 is electrically connected to a voltage source (not shown) to receive a second bit line signal VBL2. The N-type well 125 is electrically connected to a voltage source (not shown) for being biased by an N-Well bias signal VNW. The P-type well 115 may be electrically connected to a voltage source (not shown) for being biased by a P-Well bias signal VPW.

In the following, the floating gate 150 is considered to be "programmed" when it stores a net negative charge, and is considered to be "erased" when it stores a net positive charge. In particular, the floating gate 150 is programmed when it stores a negative charge that is sufficient to turn on the P-channel transistor 120 and keep the N-channel transistor 110 turned off when a read voltage is applied to the memory cell 10 through the word line 160. The floating gate 150 is erased when it stores a positive charge that is sufficient to turn on the N-channel transistor 110 and keep the P-channel transistor 120 turned off when a read voltage is applied to the memory cell 10 through the word line 160.

By using the word line 160, the first and second bit lines 130, 140, and the N-type well 125 and P-type well 115 to control operation of the N-channel transistor 110 and the P-channel transistor 120, the memory cell 10 is programmed by hot carrier injection (HCI), such as CHEI, and erased by band-to-band hot hole (BBHH) injection, as will be explained below.

Figure 6:
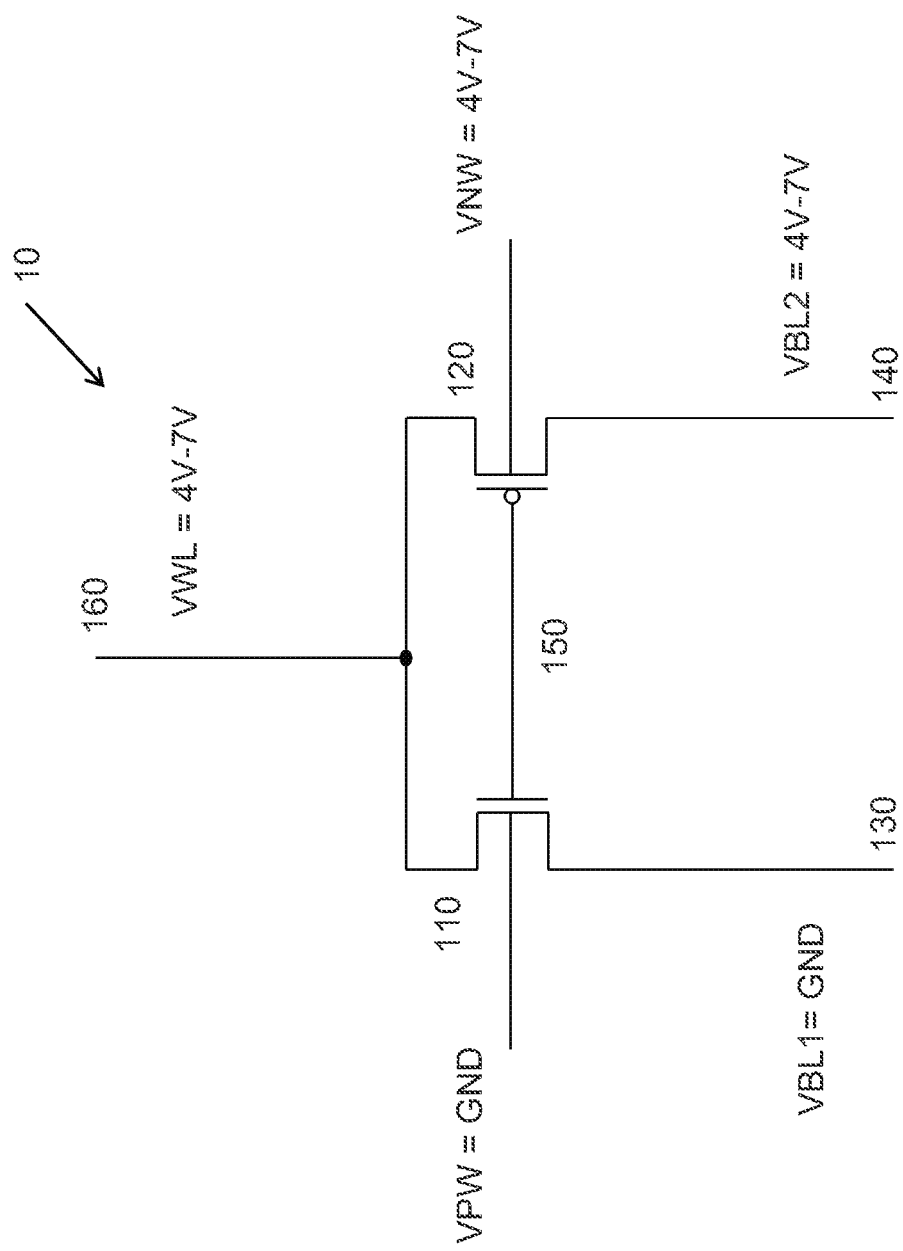
FIG. 6 is a diagram of a program operation in accordance with various embodiments of the present disclosure.

The memory cell 10 is programmable by various program operations, one of which is shown in FIG. 6. During the program operation shown in FIG. 6, a programming voltage in a range of about 4 Volts to about 7 Volts is applied through the word line 160 to both the drain terminal of the N-channel transistor 110 and the source terminal of the P-channel transistor 120. The source terminal of the N-channel transistor 110 is grounded, and the drain terminal of the P-channel transistor 120 may be 4V-7V, for example. Under these voltage conditions, the source, drain, and well terminals of the P-channel transistor 120 are all biased at the programming voltage, such that the P-channel transistor 120 and the floating gate 150 act similarly to a stacked gate of the N-channel transistor 110, with the programming voltage coupled to the floating gate 150. Thus, electron-hole pairs are generated in the drain region of the N-channel transistor 110. The electrons are accelerated by a lateral electric field toward the channel region of the N-channel transistor 110, and some of the electrons attain sufficient energy to be injected into the floating gate 150 in what is known as hot carrier injection (or channel hot electron injection, CHEI). As described, the programming voltage may be in a range of about 4 Volts to about 7 Volts (higher than a hot channel injection programming threshold), for example, but it is understood that as critical dimensions and gate oxide thickness decrease, programming voltage required to achieve a similar hot carrier injection effect as described above may decrease. In some embodiments, a range of about 5.5 Volts to about 6.5 Volts may be used for the programming voltage.

Figure 7:
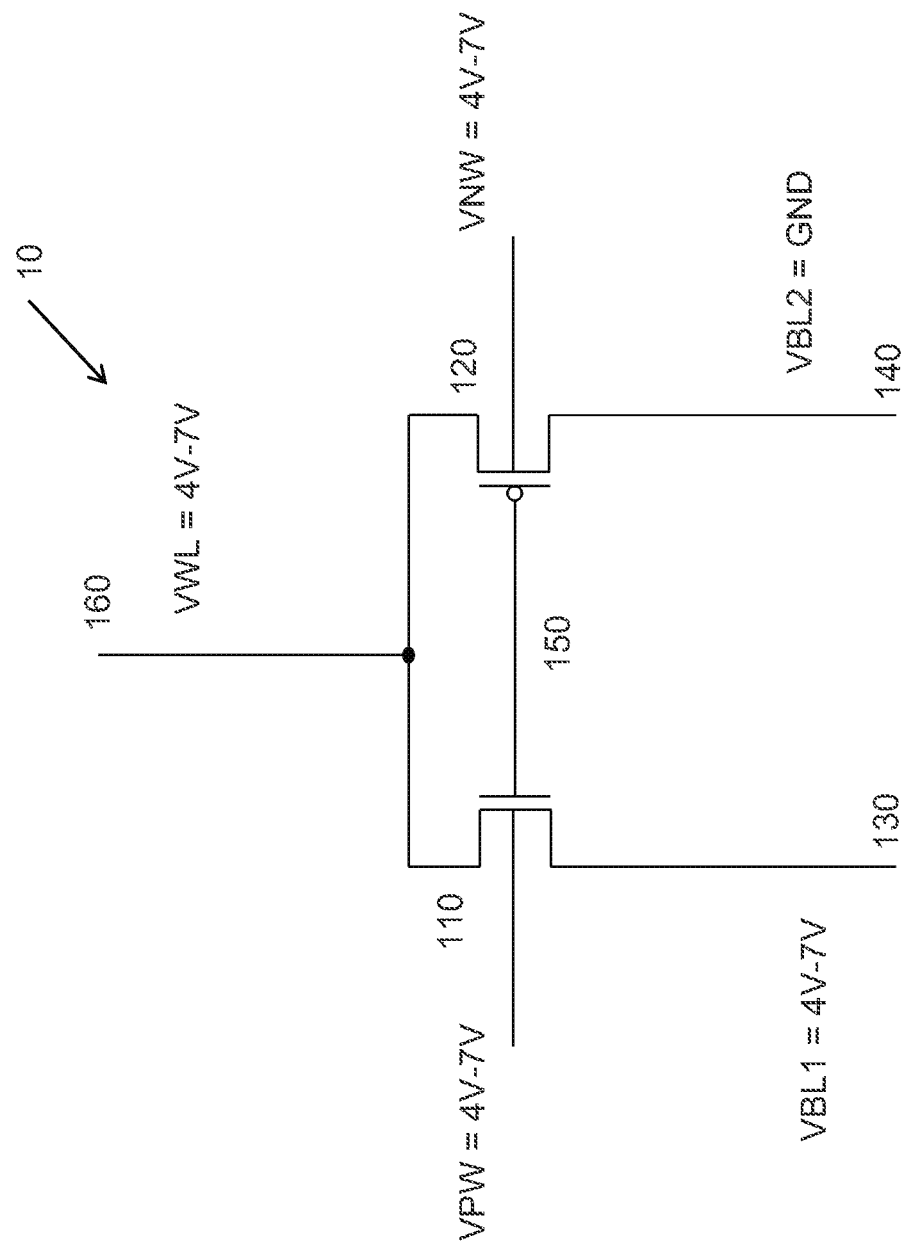
FIG. 7 is a diagram of a program operation in accordance with various embodiments of the present disclosure.

A program operation according to various embodiments is shown in FIG. 7. The program operation shown in FIG. 7 is similar to that shown in FIG. 6, except that the ground node is the drain terminal of the P-channel transistor 120. As shown in FIG. 7, under these voltage conditions, electron-hole pairs are generated by channel hot hole induced hot electron (CHHIHE) in the drain region of the P-channel transistor 120, and electrons are able to attain sufficient energy to be injected into the floating gate 150. The programming voltage may be in a range of about 4 Volts to about 7 Volts (higher than a hot channel injection programming threshold), but it is understood that as critical dimensions and gate oxide thickness decrease, programming voltage required to achieve a similar hot carrier injection effect as described above may decrease. In some embodiments, a range of about 5.5 Volts to about 6.5 Volts may be used for the programming voltage.

Figure 8:
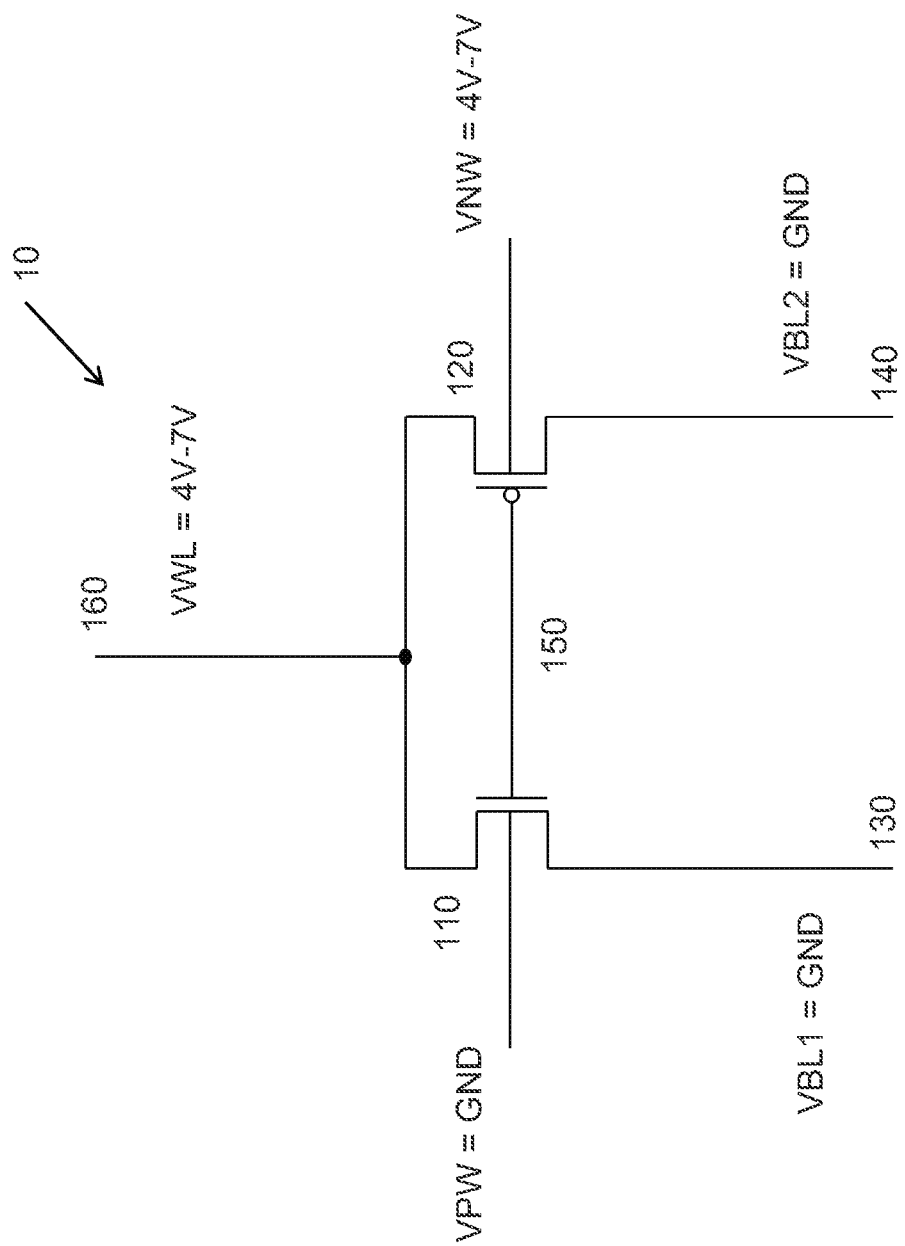
FIG. 8 is a diagram of a program operation in accordance with various embodiments of the present disclosure.

A program operation according to various embodiments is shown in FIG. 8. The program operation shown in FIG. 8 is similar to that shown in FIG. 6, except that both the source terminal of the N-channel transistor 110 and the drain terminal of the P-channel transistor 120 are grounded. As shown in FIG. 8, under these voltage conditions, electrons are able to attain sufficient energy to be injected into the floating gate 150. The programming voltage may be in a range of about 4 Volts to about 7 Volts (higher than a hot channel injection programming threshold), but it is understood that as critical dimensions and gate oxide thickness decrease, programming voltage required to achieve a similar hot carrier injection effect as described above may decrease. In some embodiments, a range of about 5.5 Volts to about 6.5 Volts may be used for the programming voltage.

Figure 9:
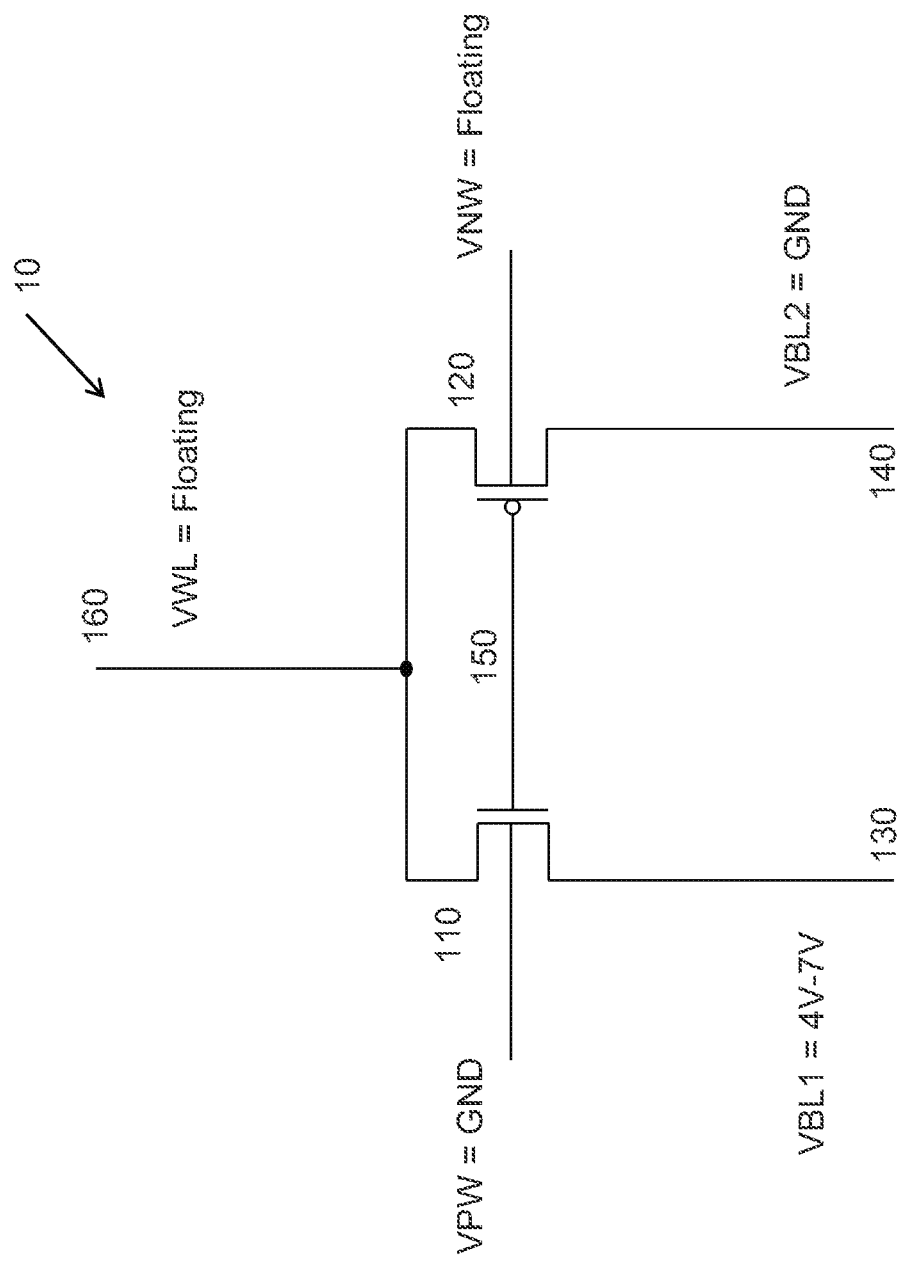
FIG. 9 is a diagram of an erase operation in accordance with various embodiments of the present disclosure.

An erase operation according to various embodiments is shown in FIG. 9. Initially, the floating gate 150 may be programmed, such that a net excess of electrons is present in the floating gate 150 to turn on the P-channel transistor 120 in the presence of a read voltage on the word line 160. During the erase operation, an erase voltage of about 4V to 7V is applied through the first bit line 130 to the source terminal of the N-channel transistor 110, the drain terminal of the P-channel transistor 120 is grounded, and the drain terminal of the N-channel transistor 110 and the source terminal of the P-channel transistor 120 are floating. The well terminal of the N-channel transistor 110 is grounded, which sets up reverse biasing between the N+ source of the N-channel transistor 110 and the P-well (or P-substrate). As shown in FIG. 9, under these voltage conditions, electron-hole pairs are generated in the source region of the N-channel transistor 110. The holes are accelerated by a lateral electric field toward the channel region of the N-channel transistor 110, and some of the holes attain sufficient energy to be injected into the floating gate 150 in a process known as band-to-band hot hole (BBHH) injection. As the holes accumulate in the floating gate 150, a net positive charge builds, which will act to turn on the N-channel transistor 110 and turn off the P-channel transistor 120 when a read voltage is applied to the word line 160. The source terminal of the P-channel transistor 120 may be grounded, which aids in attracting hot holes to be injected into the floating gate 150. By injecting more holes into the floating gate 150, read margin can be improved in the memory cell 10. As described, the erase voltage may be in a range of about 4 Volts to about 7 Volts, but it is understood that as critical dimensions and gate oxide thickness decrease, erase voltage required to achieve a similar BBHH injection effect as described above may decrease. In some embodiments, a range of about 5.5 Volts to about 6.5 Volts may be used for the programming voltage.

Figure 10:
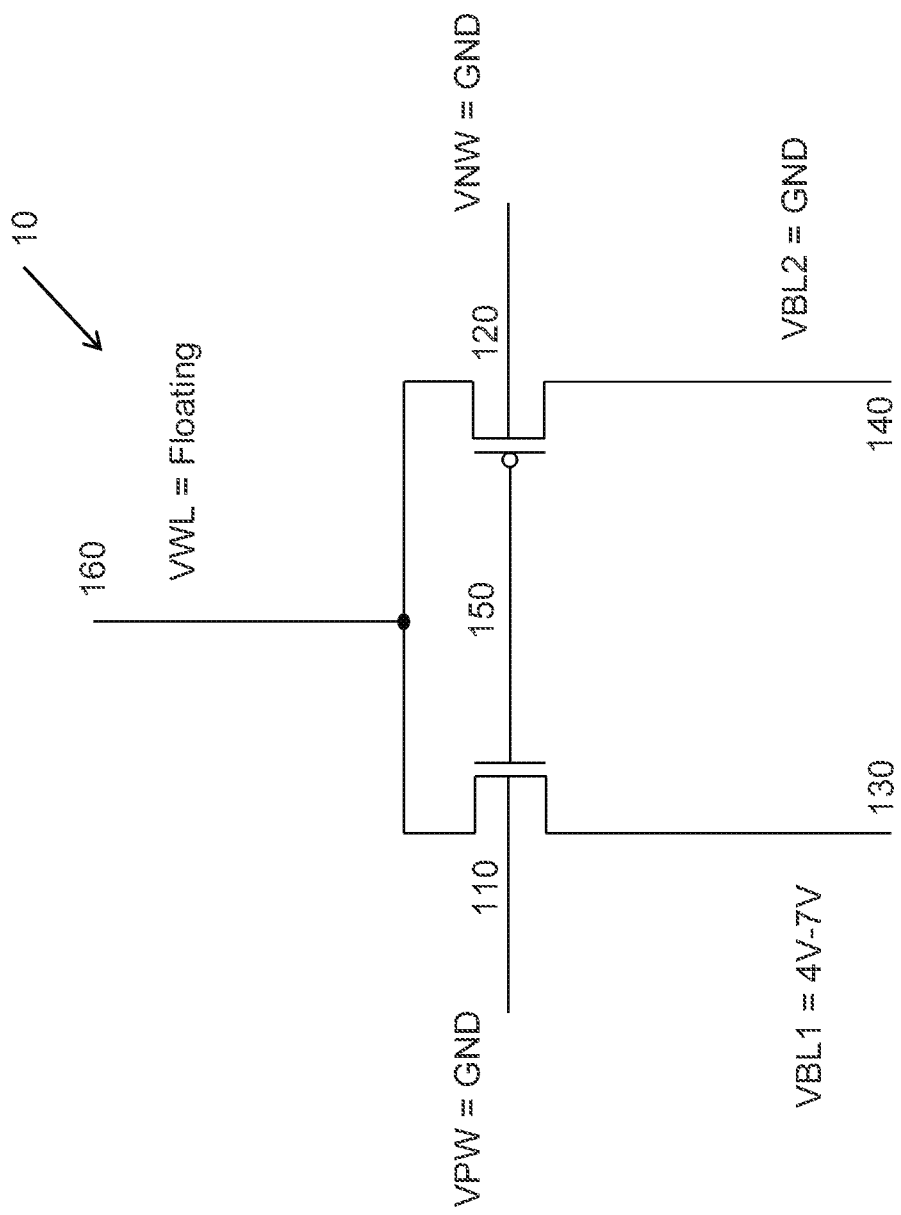
FIG. 10 is a diagram of an erase operation in accordance with various embodiments of the present disclosure.

An erase operation according to various embodiments is shown in FIG. 10. The erase operation shown in FIG. 10 is similar to that shown in FIG. 9, except that the N-well terminal of the P-channel transistor 120 is grounded. As shown in FIG. 10, under these voltage conditions, holes are able to attain sufficient energy to be injected into the floating gate 150. The erase voltage may be in a range of about 4 Volts to about 7 Volts, but it is understood that as critical dimensions and gate oxide thickness decrease, erase voltage required to achieve a similar BBHH injection effect as described above may decrease. In some embodiments, a range of about 5.5 Volts to about 6.5 Volts may be used for the programming voltage.

Figure 11:
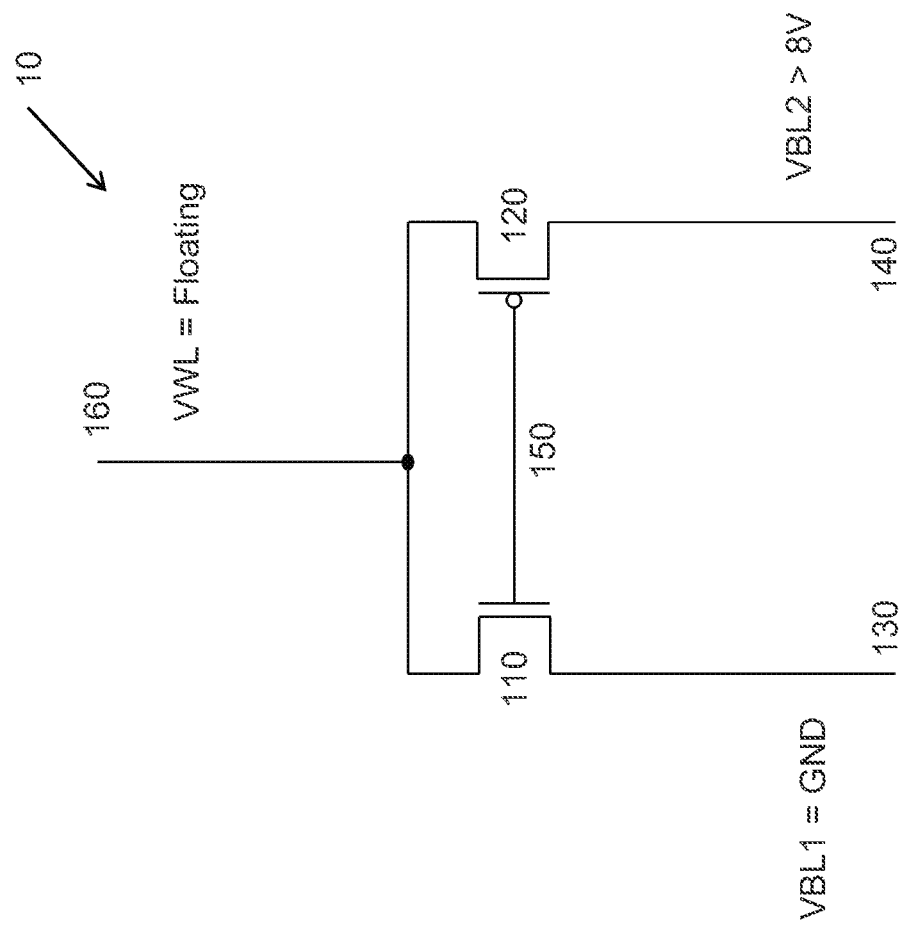
FIG. 11 is a diagram of an erase operation in accordance with various embodiments of the present disclosure.

An erase operation according to various embodiments is shown in FIG. 11. During the erase operation, an erase voltage of greater than about 8V is applied through the second bit line 140 to the drain terminal of the P-channel transistor 120, the source terminal of the P-channel transistor 120 and the drain terminal of the N-channel transistor 110 are floating, and the source terminal of the N-channel transistor 110 is grounded. Under these voltage conditions, Fowler-Nordheim tunneling can occur to erase the floating gate 150 by removing electrons from the floating gate 150.

Figure 12:
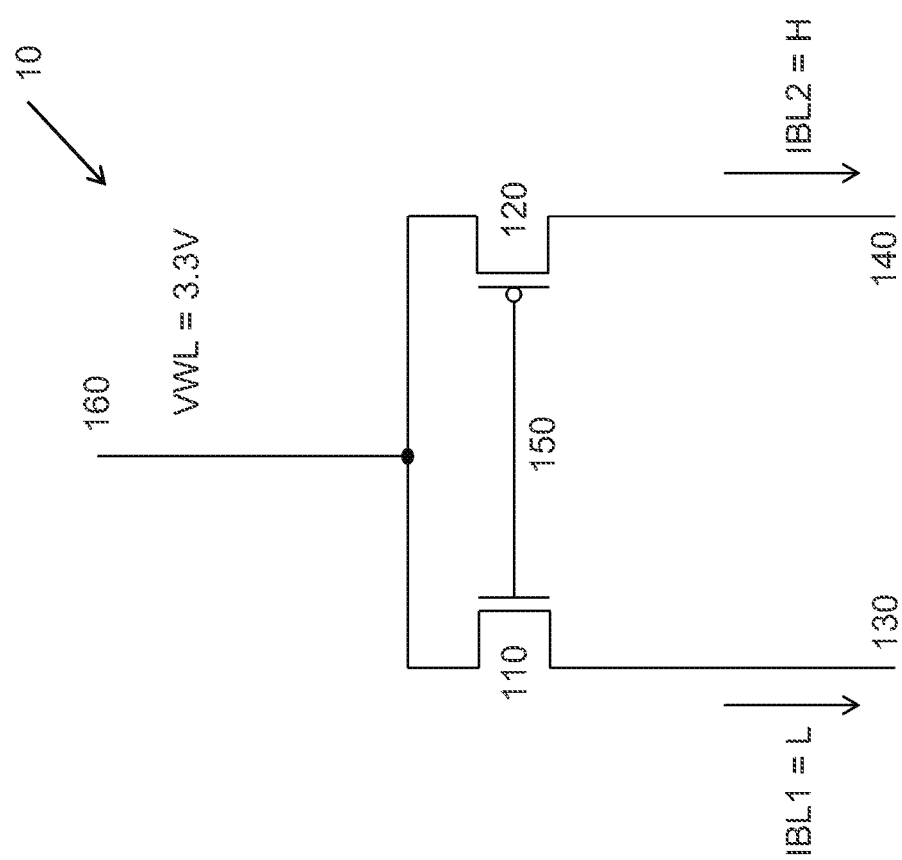
FIGS. 12 and 13 are diagrams of a read operation in accordance with various embodiments of the present disclosure.
Figure 13:
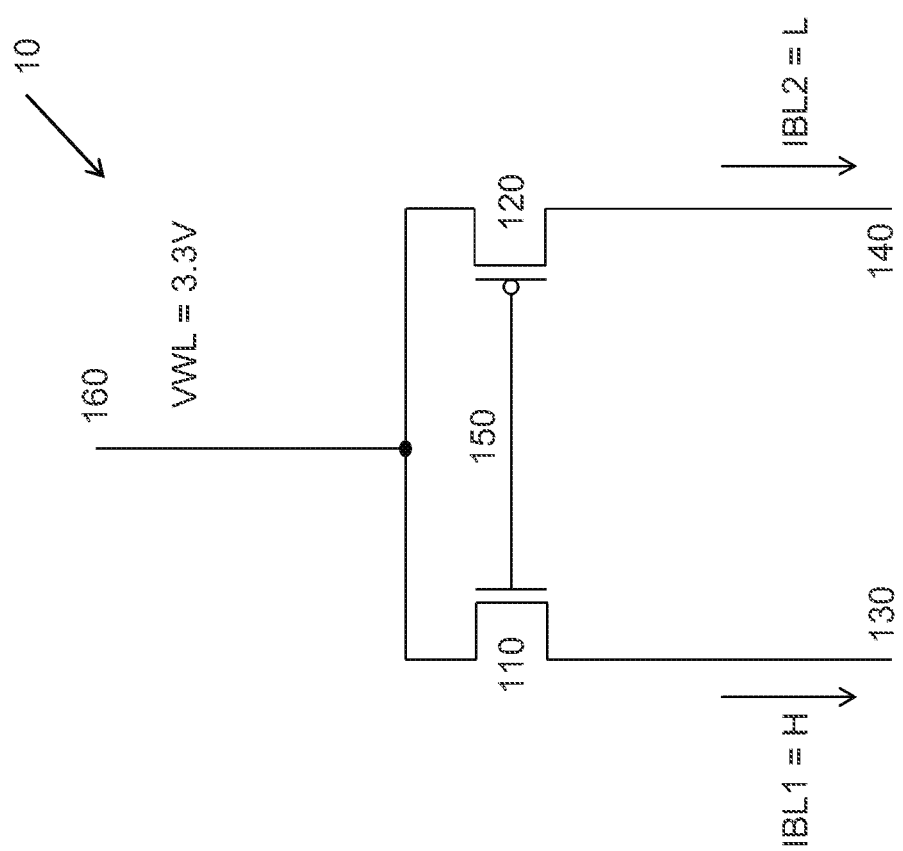

Read operations according to various embodiments are shown in FIG. 12 and FIG. 13. When the memory cell 10 is programmed, net negative charge is trapped in the floating gate 150, so that when a read voltage, e.g. 3.3 Volts, is applied through the word line 160 to the drain of the N-channel transistor 110 and the source terminal of the P-channel transistor 120, the P-channel transistor 120 is turned on, and the N-channel transistor 110 is turned off (shown in FIG. 12). Thus, first bit line current IBL1 flowing through the N-channel transistor 110 is low, while second bit line current IBL2 flowing through the P-channel transistor 120 is high. The first and second bit line currents IBL1, IBL2 can be sensed individually or differentially. To sense individually, the first bit line current IBL1 may be sensed while the second bit line 140 is floated, and the second bit line current IBL2 may be sensed while the first bit line 130 is floated. By using a differential read scheme, the memory cell 10 can be scaled down to 50 Angstrom gate oxide thickness or lower, and use a read voltage of about 2.5 Volts or less.

Referring to FIG. 13, when the memory cell 10 is erased, net positive charge is trapped in the floating gate 150, so that when the read voltage, e.g. 3.3 Volts, is applied through the word line 160 to the drain of the N-channel transistor 110 and the source terminal of the P-channel transistor 120, turning on the N-channel transistor 110, and turning off the P-channel transistor 120. Thus, first bit line current IBL1 flowing through the N-channel transistor 110 is high, while second bit line current IBL2 flowing through the P-channel transistor 120 is low. The first and second bit line currents IBL1, IBL2 can be sensed individually or differentially. To sense individually, the first bit line current IBL1 may be sensed while the second bit line 140 is floated, and the second bit line current IBL2 may be sensed while the first bit line 130 is floated. By using a differential read scheme, the memory cell 10 can be scaled down to 50 Angstrom gate oxide thickness or lower, and use a read voltage of about 2.5 Volts or less.

Table 1 summarizes operation voltages of the memory cell 10 for program, erase, and read modes in accordance with various embodiments of the present disclosure.

TABLE 1

| | | VWL | VBL1 | VPW | VBL2 | VNW |
|---|---|---|---|---|---|---|
| Program | 1 | 4 V-7 V | GND | GND | 4 V-7 V | 4 V-7 V |
| | 2 | 4 V-7 V | 4 V-7 V | 4 V-7 V | GND | 4 V-7 V |
| | 3 | 4 V-7 V | GND | GND | GND | 4 V-7 V |
| Erase | 1 | Floating | 4 V-7 V | GND | GND | Floating |
| | 2 | Floating | 4 V-7 V | GND | GND | GND |
| | 3 | Floating | GND | GND | >8 V | Floating |
| Read | 1 | 3.3 V | GND | GND | GND | 3.3 V |
| | 2 | 3.3 V | GND | GND | Floating | 3.3 V |
| | 3 | 3.3 V | Floating | GND | GND | 3.3 V |

Figure 14:
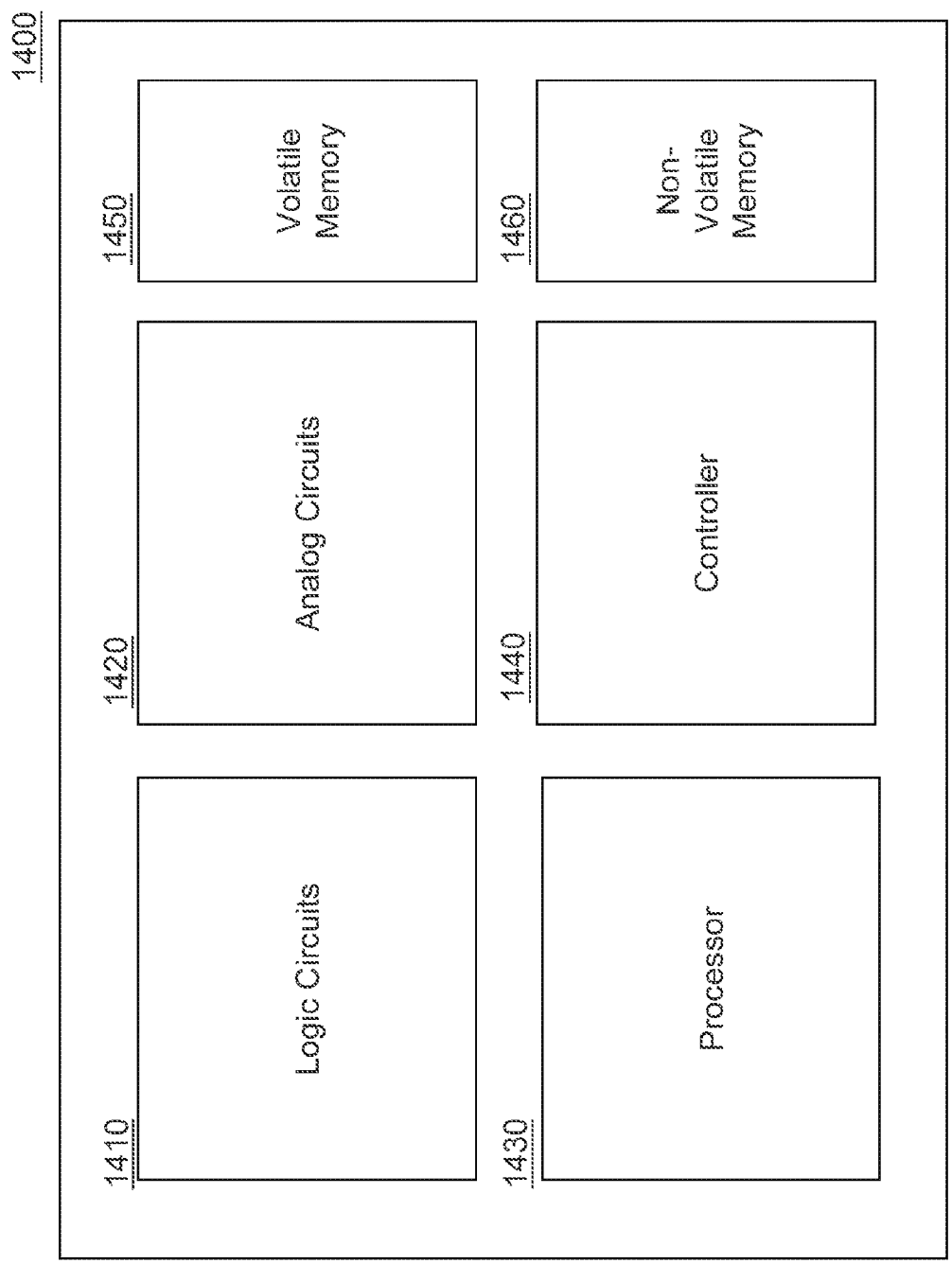
FIG. 14 is a block diagram of an integrated circuit die that uses the memory cell.
Figure 15:
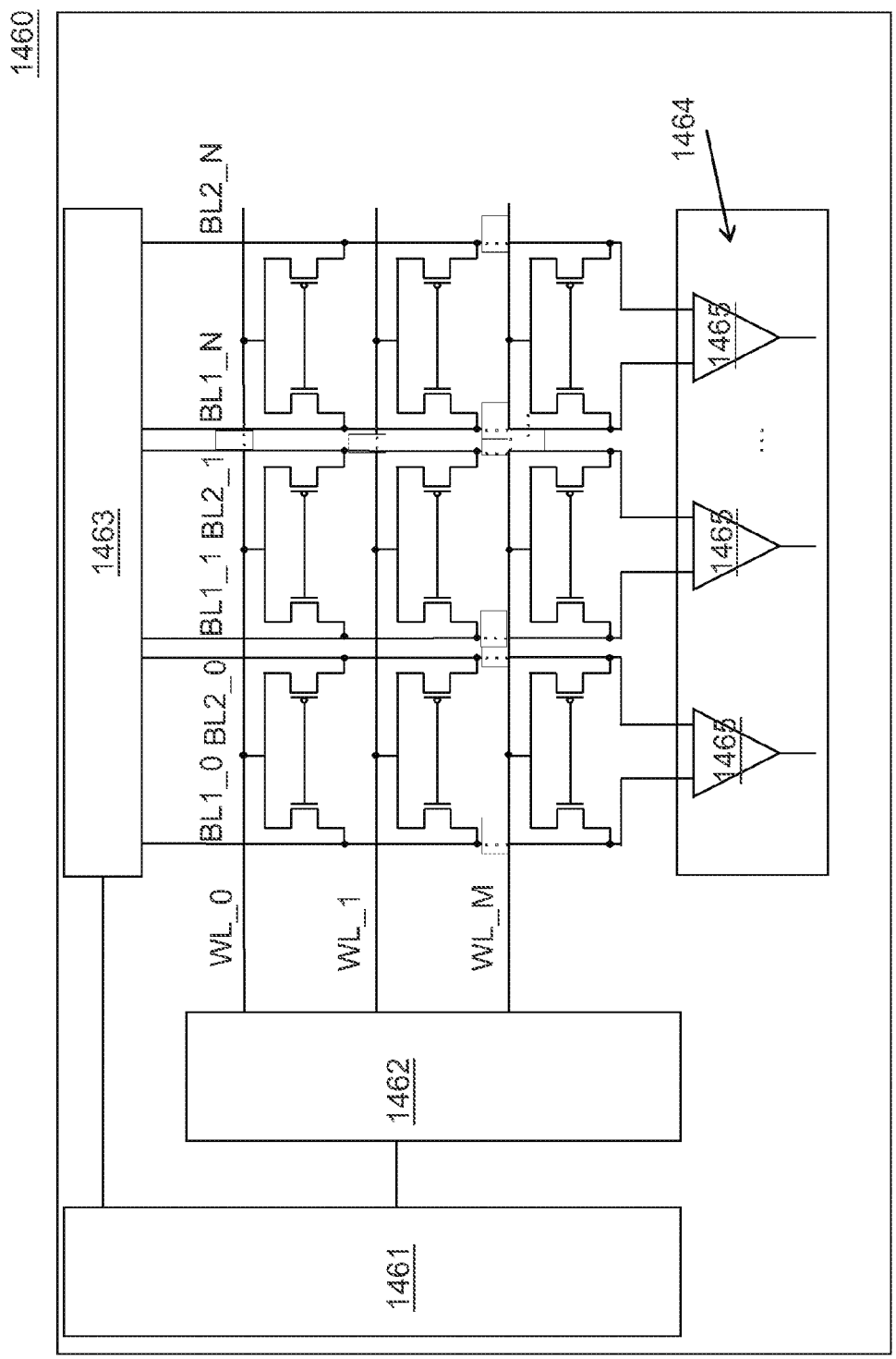
FIG. 15 is a diagram of the non-volatile memory of FIG. 14.

An integrated circuit die 1400 using the memory cell 10 is shown in FIG. 14. The integrated circuit die 1400 in general may include at least one of logic circuits 1410, analog circuits 1420, one or more processors 1430, one or more controllers 1440, and volatile memory 1450. Examples of logic circuits 1410 include logic gates, multiplexers, registers, counters, timers, baseband decoders, digital filters, and the like. The analog circuits 1420 may include amplifiers, filters, mixers, power amplifiers, phase-locked loops, frequency synthesizers, receiver front ends, sensors, and the like. The volatile memory circuits 1450 may include dynamic random access memory (DRAM), static random access memory (SRAM), and the like. The non-volatile memory 1460, shown in detail in FIG. 15, comprises a plurality of memory cells identical to the memory cell 10, such as the memory array 50 shown in FIG. 5. The non-volatile memory 1460 may further comprise addressing logic 1461, word line drivers 1462 for providing the word line voltage VWL to the word line 160, bit line drivers 1463 for providing the first and second bit line voltages VBL1, VBL2 to the first and second bit lines 130, 140, and read-out circuitry 1464 including sense circuits 1465 for detecting the differential current of the first and second bit lines 130, 140. The sense circuits 1465 include operational amplifiers, for example.

Embodiments may achieve advantages. The memory cell 10 is logic-compatible, meaning that no extra process steps are required to integrate the memory cell 10 in normal logic semiconductor manufacturing processes. The memory cell 10 is also multi-time programmable (MTP). Differential read is possible with the memory cell 10, which increases read margin, and also makes the memory cell 10 scalable to 50 Angstrom gate oxide. The memory cell 10 only uses two transistors, which makes it an effective solution for applications requiring low area.

In accordance with various embodiments of the present disclosure, a non-volatile memory cell comprises an N-channel transistor having a drain terminal electrically connected to a word line, and a source terminal electrically connected to a first bit line, and a P-channel transistor having a source terminal electrically connected to the word line, and a drain terminal electrically connected to a second bit line. Gate terminals of the N-channel transistor and the P-channel transistor are electrically connected and floating.

A method of programming a memory device is provided in accordance with various embodiments of the present disclosure. The method comprises applying a first voltage to a drain terminal of an N-channel transistor and a source terminal of a P-channel transistor sharing a floating gate with the N-channel transistor, and applying a second voltage to at least one of a source terminal of the N-channel transistor, a drain terminal of the P-channel transistor, and a well terminal of the P-channel transistor. The first voltage is higher than the second voltage by a channel hot injection programming threshold.

A method of reading a memory device is provided in accordance with various embodiments of the present disclosure. The method comprises applying a read voltage to a drain terminal of an N-channel transistor and a source terminal of a P-channel transistor sharing a floating gate with the N-channel transistor, and sensing at least one of a first output current at a source terminal of the N-channel transistor and a second output current at a drain terminal of the P-channel transistor.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. As but one example, even lower programming voltages than those described herein are within the contemplated scope of the present invention, particularly as processing technology evolves to allow for smaller critical dimensions and thin film thicknesses. Accordingly, the appended claims are intended to include within their scope such processes, machines, manufacture, compositions of matter, means, methods, or steps.

What is claimed is:

1. A structure comprising:
    a substrate;
    a first transistor having a first drain, a first source, and a first channel region extending between the first drain and the first source, wherein the first transistor is disposed in a p-well, and wherein the p-well has a first edge and a second edge opposite the first edge;
    a second transistor having a second drain, a second source, and a second channel region extending between the second drain and the second source, wherein the second transistor is formed in an n-well, wherein the n-well has a third edge and a fourth edge opposite the third edge, and wherein the second edge of the p-well and the third edge of the n-well are interposed between the first edge of the p-well and the fourth edge of the n-well;
    a floating gate electrode extending over both the first channel region and the second channel region, wherein the floating gate electrode overlaps the second edge of the p-well and the third edge of the n-well, and wherein the floating gate electrode does not overlap the first edge of the p-well and the fourth edge of the n-well;
    a first connection electrically connecting the first drain and a word line;
    a second connection electrically connecting the second source and the word line, the second drain not electrically and not physically interposed between the second source and the word line;
    a third connection electrically connecting the first source and a first bit line; and a fourth connection electrically connecting the second drain and a second bit line.

2. The structure of claim 1, wherein the word line is formed in a first metal layer extending over the first transistor and the second transistor.

3. The structure of claim 1, wherein the first bit line is formed in a second metal layer and the third connection includes a portion formed in a first metal layer and a via contact electrically connecting the portion formed in the first metal layer to the first bit line.

4. The structure of claim 3, wherein the portion formed in the first metal layer is parallel to the word line and contacts a portion of the first bit line that is perpendicular to the word line.

5. The structure of claim 1, wherein the second bit line is formed in a second metal layer and the fourth connection includes a portion formed in a first metal layer and a via contact electrically connecting the portion formed in the first metal layer to the second bit line.

6. The structure of claim 5, wherein the portion formed in the first metal layer is parallel to the word line and contacts a portion of the second bit line that is perpendicular to the word line.

7. The structure of claim 1, wherein the word line is formed in a first metal layer and the first bit line and the second bit line are formed in a second metal layer overlying the first metal layer.

8. The structure of claim 1, wherein the first bit line does not overlap the p-well and the n-well.

9. The structure of claim 1, wherein the second bit line does not overlap the p-well and the n-well.

10. A memory array comprising:
a first memory cell, the first memory cell including:
a first transistor and a second transistor, the first and second transistors sharing a first common floating gate, the first transistor and the second transistor each having a source and a drain, wherein the first transistor is disposed in a p-well and the second transistor is disposed in an n-well, wherein the first common floating gate extends over the p-well and the n-well, wherein the first common floating gate has a first rectangular shape, and wherein a long axis of the first common floating gate is perpendicular to a first source-to-drain direction of the first transistor and a second source-to-drain direction of the second transistor;
a common word line electrically connected to the drain of the first transistor and the source of the second transistor, the drain of the second transistor not electrically and not physically interposed between the source of the second transistor and the common word line, wherein the common word line has a second rectangular shape within the first memory cell, and wherein a long axis of the common word line is parallel to the long axis of the first common floating gate;
a first bit line connected to the source of the first transistor, wherein the first bit line does not overlap the p-well and the n-well, wherein the first bit line has a third rectangular shape within the first memory cell, and wherein a long axis of the first bit line is perpendicular to the long axis of the first common floating gate; and
a second bit line connected to the drain of the second transistor, wherein the second bit line does not overlap the p-well and the n-well, wherein the second bit line has a fourth rectangular shape within the first memory cell, and wherein a long axis of the second bit line is perpendicular to the long axis of the first common floating gate; and
a second memory cell, the second memory cell including:
a third transistor and a fourth transistor, the third transistor and fourth transistor sharing a second common floating gate, the common word line electrically connected to a drain of the third transistor and a source of the fourth transistor;
a third bit line connected to a source of the third transistor; and
a fourth bit line connected to a drain of the fourth transistor.

11. The memory array of claim 10, wherein the common word line is formed in a first metal layer overlaying the first and second memory cell and the first bit line, the second bit line, the third bit line, and the fourth bit line are formed in a second metal layer overlaying the first metal layer.

12. The memory array of claim 11, wherein the source of the first transistor is electrically connected to the first bit line through a connection that includes a portion in the first metal layer and a via contact electrically connecting the portion to the first bit line.

13. The memory array of claim 12, wherein the first common floating gate, the common word line, and the portion in the first metal layer are parallel to one another.

14. The memory array of claim 13, wherein the portion in the first metal layer connects to a portion of the first bit line that is perpendicular to the common word line.

15. The memory array of claim 13, further including a gate oxide underlying the first common floating gate, the gate oxide having a thickness of about 50 Angstrom.

16. The memory array of claim 15, wherein the first memory cell is configured to be programmed by channel hot electron injection.

17. The memory array of claim 10, wherein the first common floating gate does not overlap the first bit line and the second bit line.

18. An integrated circuit comprising:
a processor configured to perform programmed functions; and
a programmable non-volatile memory array organized into rows and columns, each memory cell in a row sharing a common word line and each memory cell in a column sharing a first common bit line and a second common bit line, each memory cell further including:
a first transistor and a second transistor, the first transistor and second transistor sharing a common floating gate, the first transistor and the second transistor each having a source and a drain, the first transistor being disposed in a p-well and the second transistor being disposed in an n-well, wherein the common floating gate overlaps the p-well and the n-well, wherein the common floating gate does not extend across the p-well and the n-well, wherein the first common bit line does not overlap the p-well and the n-well, wherein the second common bit line does not overlap the p-well and the n-well, wherein the common floating gate does not overlap the common word line, the first common bit line, and the second common bit line, and wherein the common floating gate has a first rectangular shape;
a first electrical path between the common word line electrically connecting the drain of the first transistor and the source of the second transistor, the drain of the second transistor not electrically and not physically interposed between the source of the second transistor and the common word line;

a second electrical path between the first common bit line and a source of the first transistor, wherein the second electrical path comprises a first conductive line, wherein the first conductive line has a second rectangular shape, and wherein a long axis of the first conductive line is parallel to a long axis of the common floating gate; and a third electrical path between the second common bit line and a drain of the second transistor.

19. The integrated circuit of claim 18, wherein the first electrical path includes a first vertical contact between the common word line and the drain of the first transistor, and a second vertical contact between the common word line and the source of the second transistor.

20. The integrated circuit of claim 18, wherein the second electrical path further comprises a vertical contact between the first conductive line and the first common bit line, the first conductive line being formed in a first metal layer, the first common bit line being formed in a second metal layer overlaying the first metal layer.

* * * * *